(12) United States Patent
Chen et al.

(10) Patent No.: US 12,326,629 B2
(45) Date of Patent: Jun. 10, 2025

(54) ELECTRONIC DEVICE

(71) Applicant: InnoLux Corporation, Miao-Li County (TW)

(72) Inventors: Hao-Yu Chen, Miao-Li County (TW); Hong-Sheng Hsieh, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/480,643

(22) Filed: Oct. 4, 2023

(65) Prior Publication Data
US 2024/0027825 A1 Jan. 25, 2024

Related U.S. Application Data

(63) Continuation of application No. 17/933,177, filed on Sep. 19, 2022, now Pat. No. 11,809,037.

(60) Provisional application No. 63/271,730, filed on Oct. 26, 2021.

(30) Foreign Application Priority Data

Aug. 10, 2022 (CN) .......................... 202210954821.3

(51) Int. Cl.
 *G02F 1/1335* (2006.01)
 *G02F 1/13357* (2006.01)
 *H10K 59/50* (2023.01)

(52) U.S. Cl.
 CPC .. *G02F 1/133531* (2021.01); *G02F 1/133602* (2013.01); *G02F 1/13362* (2013.01); *H10K 59/50* (2023.02)

(58) Field of Classification Search
 CPC ............. G02F 1/133531; G02F 1/1323; G02F 1/133602; G02F 1/13362; H10K 59/50
 See application file for complete search history.

(56) References Cited

U.S. PATENT DOCUMENTS

| | | | | |
|---|---|---|---|---|
| 5,835,179 A | * | 11/1998 | Yamanaka | G02F 1/1335 349/161 |
| 2020/0326567 A1 | * | 10/2020 | Fang | G02F 1/1323 |
| 2021/0271125 A1 | * | 9/2021 | Wu | G09G 3/3648 |
| 2021/0341798 A1 | * | 11/2021 | Woodgate | G02F 1/133769 |
| 2022/0326574 A1 | * | 10/2022 | Matsushima | G02F 1/13471 |

* cited by examiner

*Primary Examiner* — James A Dudek
(74) *Attorney, Agent, or Firm* — McClure, Qualey & Rodack, LLP

(57) ABSTRACT

An electronic device is provided. The electronic device includes first and second viewing angle adjusting units, a display unit, and first to third polarizers. The display unit is disposed between the first and second viewing angle adjusting units. The first and second viewing angle adjusting units are respectively disposed between the first and second polarizers and between the second and third polarizers. The first viewing angle adjusting unit and the display unit share the second polarizer. The first polarizer have a first side and a second side closer to the display unit than the first side. A light from the display unit passes through the first viewing angle adjusting unit and the first polarizer to provide an output light from the first side. An angle of an absorption axis of the second polarizer and an angle of an absorption axis of the third polarizer are the same.

8 Claims, 9 Drawing Sheets

ELECTRONIC DEVICE

CROSS REFERENCE TO RELATED APPLICATIONS

This application is a Continuation of application Ser. No. 17/933,177, filed Sep. 19, 2022 (now U.S. Pat. No. 11,809, 037), which claims the benefit of U.S. Provisional Application No. 63/271,730, filed on Oct. 26, 2021 and priority of China Patent Application No. 202210954821.3, filed on Aug. 10, 2022, the entirety of which are incorporated by reference herein.

TECHNICAL FIELD

The present disclosure relates to an electronic device, and, in particular, to an electronic device that includes a viewing angle switchable structure.

BACKGROUND

Recently, as the concept of privacy has been paid more attention, users have attached great importance to the privacy effect of electronic devices that are necessary in daily life.

Generally, a light collimation system may be provided in an electronic device to improve the privacy effect. In addition, two privacy modules are also used to improve the privacy effect. However, in the case of using two privacy modules, more optical film need to be used due to the mismatch of polarization properties in the stacked structure. Thus, the thickness of the entire electronic device may be increased, so that the manufacturing cost may be increased.

SUMMARY

An embodiment of the present disclosure provides an electronic device. The electronic device includes a first viewing angle adjusting unit, a second viewing angle adjusting unit, a display unit, a first polarizer, a second polarizer, and a third polarizer. The display unit is disposed between the first viewing angle adjusting unit and the second viewing angle adjusting unit. The first viewing angle adjusting unit is disposed between the first polarizer and the second polarizer, the second viewing angle adjusting unit is disposed between the second polarizer and the third polarizer, and the first viewing angle adjusting unit and the display unit share the second polarizer. The first polarizer have a first side and a second side, the second side is closer to the display unit than the first side, and a light from the display unit passes through the first viewing angle adjusting unit and the first polarizer to provide an output light from the first side of the first polarizer. An angle of an absorption axis of the second polarizer and an angle of an absorption axis of the third polarizer are the same.

The electronic device of the present disclosure may be applied in various types of electronic apparatus. In order to make the features and advantages of the present disclosure more understand, some embodiments of the present disclosure are listed below in conjunction with the accompanying drawings, and are described in detail as follows.

BRIEF DESCRIPTION OF THE DRAWINGS

The present disclosure may be more fully understood from the following detailed description when read in conjunction with the accompanying drawings. It should be noted that, according to the standard practice in the industry, the various features are not drawn to scale. In fact, the dimensions of the various features may be arbitrarily increased or reduced for clarity. Furthermore, the numerical values in the drawings are for illustrative and non-limiting purposes.

DETAILED DESCRIPTION

Figure 1:
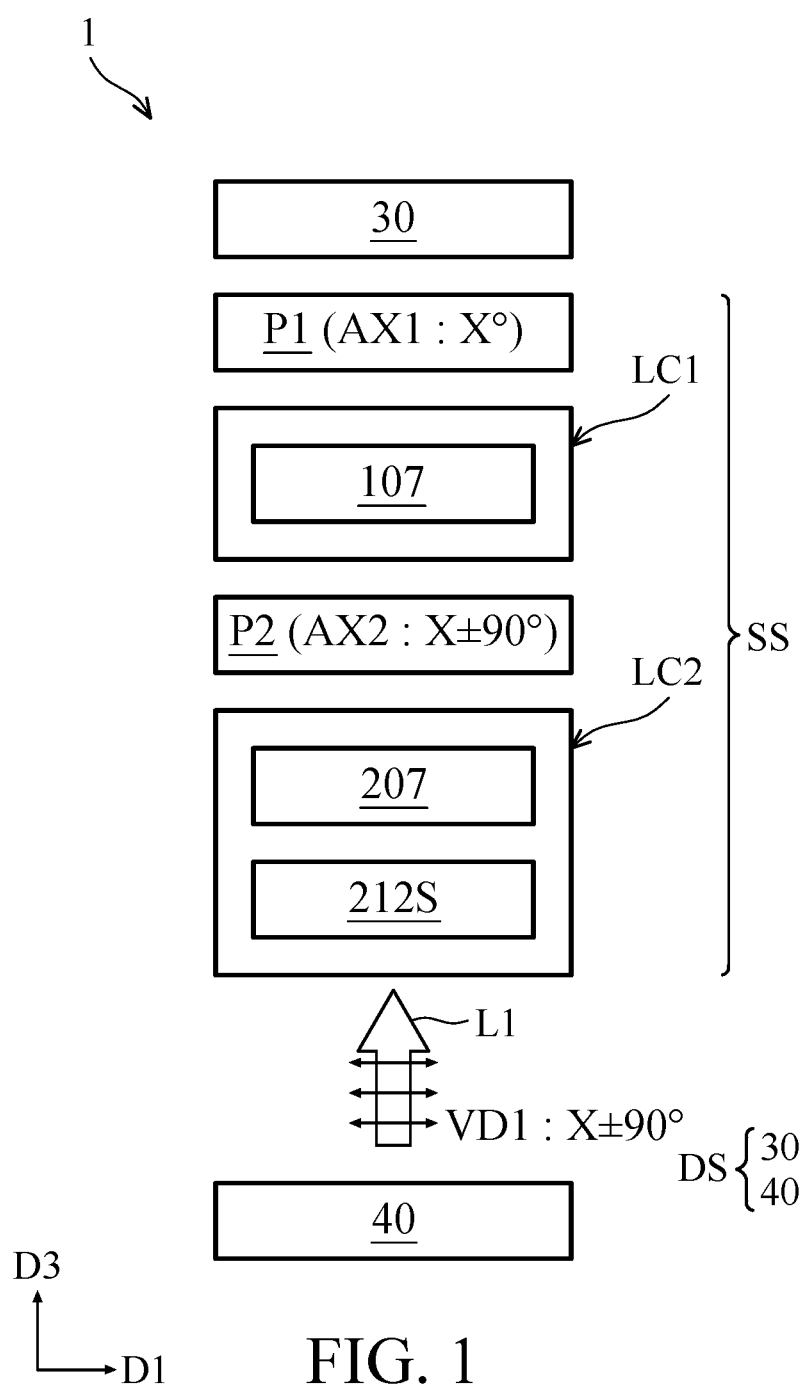
FIG. 1 is a schematic cross-sectional view of an electronic device according to some embodiments of the present disclosure.

Electronic devices of various embodiments of the present disclosure will be described in detail below. It should be understood that the following description provides many different embodiments for implementing various aspects of some embodiments of the present disclosure. The specific elements and arrangements described below are merely to clearly describe some embodiments of the present disclosure. Of course, these are only used as examples rather than limitations of the present disclosure. Furthermore, similar and/or corresponding reference numerals may be used in different embodiments to designate similar and/or corresponding elements, in order to clearly describe the present disclosure. However, the use of these similar and/or corresponding reference numerals is only for the purpose of simply and clearly description of some embodiments of the present disclosure, and does not imply any correlation between the different embodiments and/or structures discussed.

It should be understood that relative terms, such as "lower", "bottom", "higher" or "top" may be used in various embodiments to describe the relative relationship of one element of the drawings to another element. It will be understood that if the device in the drawings were turned upside down, elements described on the "lower" side would become elements on the "upper" side. The embodiments of the present disclosure may be understood together with the drawings, and the drawings of the present disclosure are also regarded as a portion of the disclosure.

Furthermore, when it is mentioned that a first material layer is located on or over a second material layer, it may include the embodiment which the first material layer and the second material layer are in direct contact and the embodiment which the first material layer and the second material layer are not in direct contact with each other, that is one or more layers of other materials is between the first material layer and the second material layer. However, if the first material layer is directly on the second material layer, it means that the first material layer and the second material layer are in direct contact.

In addition, it should be understood that ordinal numbers such as "first", "second" and the like used in the description and claims are used to modify elements and are not intended to imply and represent the element(s) have any previous ordinal numbers, and do not represent the order of a certain element and another element, or the order of the manufacturing method, and the use of these ordinal numbers is only used to clearly distinguished an element with a certain name and another element with the same name. The claims and the specification may not use the same terms, for example, a first element in the specification may be a second element in the claim.

In some embodiments of the present disclosure, terms related to bonding and connection, such as "connect", "interconnect", "bond" and the like, unless otherwise defined, may refer to two structures in direct contact, or they may refer to two structures that are not in direct contact, there being another structure disposed between the two structures. Terms related to bonding and connection may also include embodiments in which both structures are movable, or both structures are fixed. Furthermore, the terms "electrically connected" or "electrically coupled" include direct and indirect means of electrical connection.

Herein, the terms "approximately", "about", and "substantially" generally mean within 10%, within 5%, within 3%, within 2%, within 1%, or within 0.5% of a given value or range. The given value is an approximate value, that is, "approximately", "about", and "substantially" may still be implied without the specific description of "approximately", "about", and "substantially". The phrase "a range between a first value and a second value" means that the range includes the first value, the second value, and other values in between. Furthermore, any two values or directions used for comparison may have certain tolerance. If the first value is equal to the second value, it implies that there may be a tolerance within about 10%, within 5%, within 3%, within 2%, within 1%, or within 0.5% between the first value and the second value. If the first direction is perpendicular to the second direction, the angle between the first direction and the second direction may be between 80 degrees and 100 degrees. If the first direction is parallel to the second direction, the angle between the first direction and the second direction may be between 0 degrees and 10 degrees.

Certain terms may be used throughout the specification and claims in this disclosure to refer to specific elements. A person of ordinary skills in the art should be understood that electronic device manufacturers may refer to the same element by different terms. This disclosure does not intend to distinguish between elements that have the same function but with different terms. In the following description and claims, terms such as "comprising", "including" and "having" are open-ended words, so they should be interpreted as meaning "including but not limited to . . . ". Therefore, when the terms "comprising", "including" and/or "having" is used in the description of the present disclosure, it designates the presence of corresponding features, regions, steps, operations and/or elements, but does not exclude the presence of one or more corresponding features, regions, steps, operations and/or elements.

It should be understood that, in the following embodiments, features in several different embodiments may be replaced, recombined, and bonded to complete other embodiments without departing from the spirit of the present disclosure. The features of the various embodiments may be used in any combination as long as they do not violate the spirit of the disclosure or conflict with each other.

Unless otherwise defined, all terms (including technical and scientific terms) used herein have the same meaning as commonly understood by a person of ordinary skills in the art. It should be understand that these terms, such as those defined in commonly used dictionaries, should be interpreted as having meanings consistent with the relevant art and the background or context of the present disclosure, and should not be interpreted in an idealized or overly formal manner, unless otherwise defined in the embodiments of the present disclosure.

Herein, the respective directions are not limited to three axes of the rectangular coordinate system, such as the X-axis, the Y-axis, and the Z-axis, and may be interpreted in a broader sense. For example, the X-axis, the Y-axis, and the Z-axis may be perpendicular to each other, or may represent different directions that are not perpendicular to each other, but the present disclosure is not limited thereto. For convenience of description, hereinafter, the X-axis direction is the first direction D1 (the length direction), the Y-axis direction is the second direction D2 (the width direction), and the Z-axis direction is the third direction D3 (the height direction/the thickness direction). In some embodiments, the schematic cross-sectional views described herein are schematic views of the XZ plane.

In some embodiments, the electronic device of the present disclosure may include a display module, a back light module, an antenna module, a sensing module, or a tiled module, but the present disclosure is not limited thereto. The electronic device may be a foldable or flexible electronic device. The display module may be a non-self-luminous display module or a self-luminous display module. The antenna module may be a liquid crystal antenna module or a non-liquid crystal antenna module. The sensing module may be a sensing module for sensing capacitance, light, heat, or ultrasonic waves, but the present disclosure is not limited thereto. The electronic element may include passive elements and active elements, such as capacitors, resistors, inductors, diodes, transistors, and the like. The diodes may include light emitting diodes or photodiodes. The light emitting diodes may include, for example, organic light emitting diodes (OLEDs), mini light emitting diodes (mini LEDs), micro light emitting diodes (micro LEDs), or quantum dot light emitting diodes (quantum dot LED), but the present disclosure is not limited thereto. The tiled module may be, for example, a display tiled module or an antenna tiled module, but the present disclosure is not limited thereto. It should be noted that, the electronic device may be any arrangement and combination of the foregoing, but the present disclosure is not limited thereto. The present disclosure will be described below with reference to an electronic device including a display module (or further including a back light module), but the present disclosure is not limited thereto.

In addition, the shape of the electronic device may be rectangular, circular, polygonal, a shape with curved edges, or another suitable shape. The electronic device may have a peripheral system, such as a processing system, a driving system, a control system, a light source system, a shelf system, and the like to support the electronic device.

In some embodiments, additional elements may be added into the electronic device of the present disclosure. In some embodiments, some elements of the electronic device of the present disclosure may be replaced or omitted. In some embodiments, additional processing steps may be provided before, during, and/or after a manufacturing method of the electronic device. In some embodiments, some of the described processing steps may be replaced or omitted, and the order of some of the described processing steps may be interchangeable. Furthermore, it should be understood that some of the described processing steps may be replaced or deleted for other embodiments of the method. Furthermore, in the present disclosure, the number and size of each element in the drawings are for illustration only, and are not intended to limit the scope of the present disclosure.

In the present disclosure, a polarizer is an optical element capable of converting an unpolarized light into a polarized light such as a linearly polarized light. The direction of the transmission axis of the polarizer is perpendicular to the direction of the absorption axis of the polarizer. In some embodiments, when the unpolarized light irradiates the polarizer, the unpolarized light in the same (or parallel) direction as the transmission axis of the polarizer passes through the polarizer, and the unpolarized light in the same (or parallel) direction as the absorption axis of the polarizer does not pass through the polarizer. In other words, the unpolarized light perpendicular to the direction of the absorption axis of the polarizer may pass through the polarizer. Hereinafter, the angle of the absorption axis of the polarizer may be used to describe properties of the polarizer. In addition, it should be understood that when the angle of the absorption axis of the polarizer is described as "a degrees", the angle of the absorption axis of the polarizer may also be expressed as "a+180 degrees", where "a" may be any value greater than or equal to 0 to less than or equal to 360 ($0 \leq a \leq 360$). For example, when the angle of the absorption axis of the polarizer is 0 degrees (°), the angle of the absorption axis of the polarizer may also be expressed as 180 degrees. In this disclosure, the term "privacy" means that the transmittance is lower than 10%, 8%, 6%, 5%, 4%, 3%, 2%, 1%, 0.5% or lower so that the picture of the electronic device may be difficult to see.

Figure 2:
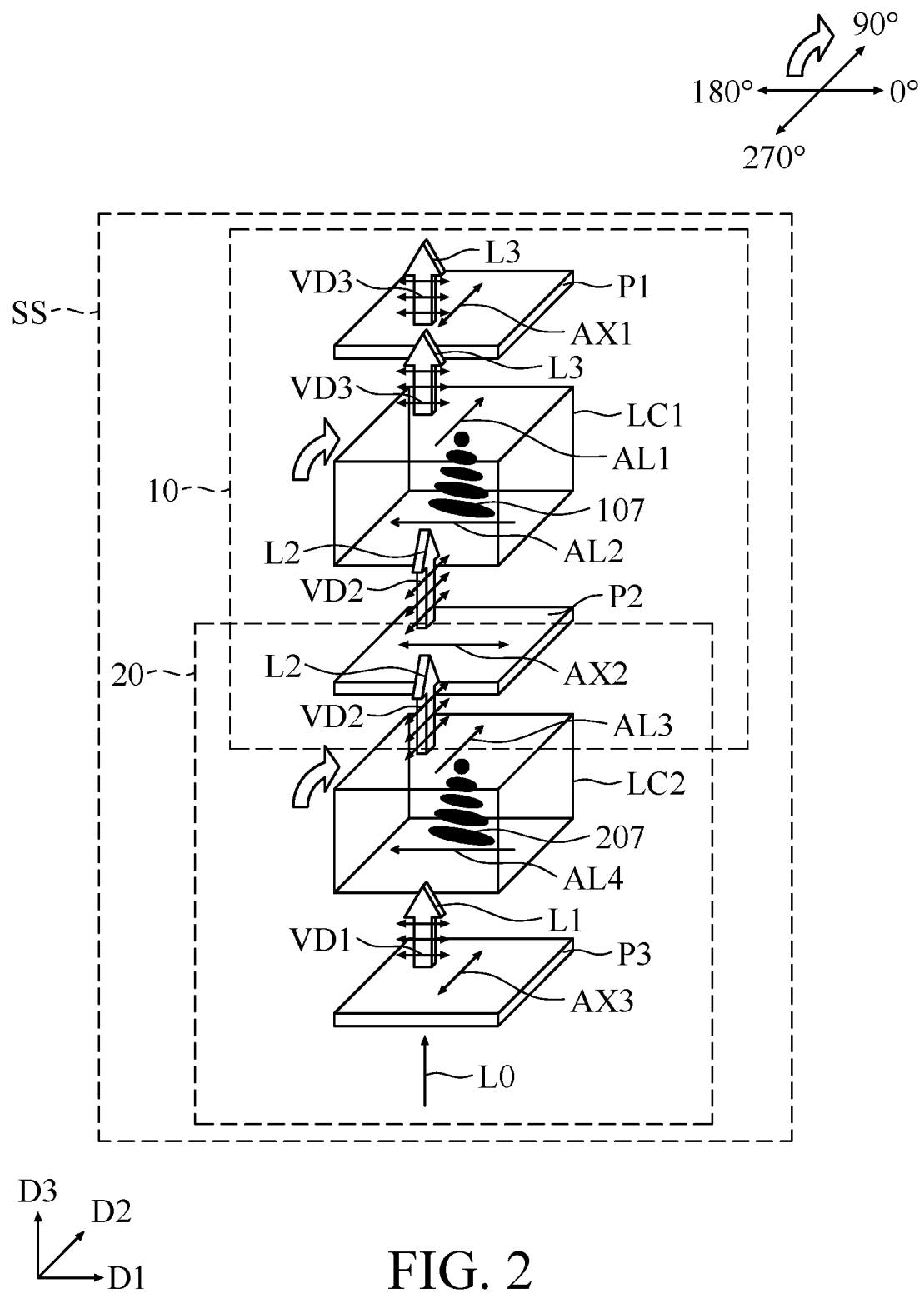
FIG. 2 to 4 are respectively three-dimensional schematic diagrams showing optical properties of an electronic device according to some embodiments of the present disclosure.

In the following, the different modes and different rotations of the liquid crystal units described in the present disclosure are defined. In some embodiments, the liquid crystal unit may be E mode or O mode. For example, when the polarization direction (i.e., the vibration direction) of the light incident on the liquid crystal unit is substantially parallel to the long axis direction of the liquid crystal molecules in the liquid crystal layer, the liquid crystal layer is an E mode liquid crystal layer. For example, as shown in FIG. 2, in the second liquid crystal unit LC2, the first polarization direction VD1 of the first light L1 incident on the second liquid crystal unit LC2 is substantially parallel to the long axis direction of the liquid crystal molecules in the second liquid crystal layer 207. Thus, the second liquid crystal layer 207 is in E mode. For example, when the polarization direction of the light incident on the liquid crystal unit is substantially perpendicular to the long axis direction of the liquid crystal molecules in the liquid crystal layer, the liquid crystal layer is an O mode liquid crystal layer. In some embodiments, it is confirmed from the viewing angle light distribution diagram that the privacy effect provided by the use of the O mode liquid crystal layer and that of the E mode liquid crystal layer are substantially the same, so the present disclosure may use the O mode liquid crystal layer and/or the E mode liquid crystal layer.

In some embodiments, the liquid crystal layer may be a left-handed liquid crystal layer or a right-handed liquid crystal layer. In some embodiments, the liquid crystal unit has a first alignment layer and a second alignment layer, and the first alignment layer and the second alignment layer have a first alignment axis and a second alignment axis, respectively. For example, when light is incident from the second alignment layer toward the first alignment layer, and the angle from the second alignment axis to the first alignment axis is clockwise, the liquid crystal layer is a left-handed liquid crystal layer. For example, as shown in FIG. 2, in the second liquid crystal unit LC2, the first light L1 is incident from the lower alignment layer (the fourth alignment axis AL4) toward the upper alignment layer (the third alignment axis AL3), and the angle from the fourth alignment axis AL4 to the third alignment axis AL3 is clockwise, so the second liquid crystal layer 207 is a left-handed liquid crystal layer. For example, when light is incident from the second alignment layer toward the first alignment layer, and the angle from the second alignment axis to the first alignment axis is counterclockwise, the liquid crystal layer is a right-handed liquid crystal layer.

FIG. 1 is a schematic cross-sectional view of an electronic device 1 according to some embodiments of the present disclosure. In some embodiments, the electronic device 1 includes a viewing angle switchable structure SS. In some embodiments, the viewing angle switchable structure SS may include a first polarizer P1, a second polarizer P2, a first liquid crystal layer 107, a second liquid crystal layer 207, and a substrate 212S. In the third direction D3, the first liquid crystal layer 107 is disposed between the first polarizer P1 and the second polarizer P2, the second liquid crystal layer 207 is disposed between the second polarizer P2 and the substrate 212S, and the polarized light (the first light L1) is incident on the second liquid crystal layer 207. The third direction D3 is the lamination direction of the above-mentioned layers, or the thickness direction of the first polarizer P1 and/or the second polarizer P2.

Wherein, the first polarizer P1 has a first absorption axis AX1, and the second polarizer P2 has a second absorption axis AX2, and the first absorption axis AX1 of the first polarizer P1 and the second absorption axis AX2 of the second polarizer P2 have different angles. For example, the difference between the angle of the first absorption axis AX1 of the first polarizer P1 and the angle of the second absorption axis AX2 of the second polarizer P2 (|the angle of the first absorption axis AX1−the angle of the second absorption axis AX2|) is 90 degrees. That is, the first absorption axis AX1 of the first polarizer P1 is "X degrees" and the second absorption axis AX2 of the second polarizer P2 is "X±90 degrees", but the present disclosure is not limited thereto.

Wherein, the angle of the first absorption axis AX1 of the first polarizer P1 is perpendicular to the polarization direction (the first polarization direction VD1) of the polarized light (the first light L1). For example, the angle of the first absorption axis AX1 of the first polarizer P1 is "X degrees", and the first polarization direction VD1 is "X±90 degrees", but the present disclosure is not limited thereto.

Refer to FIG. 1, the viewing angle switchable structure SS includes the first polarizer P1, the second polarizer P2, a first liquid crystal unit LC1, and a second liquid crystal unit LC2. In some embodiments, in the first liquid crystal unit LC1, in addition to the first liquid crystal layer 107, the first liquid crystal unit LC1 may further include substrates, alignment layers, electrodes, and the like. The second liquid crystal unit LC2 may include the second liquid crystal layer 207 and the substrate 212S. In addition, the second liquid crystal unit LC2 may further include substrates, alignment layers, electrodes, and the like. To simplify the description, some elements included in the first liquid crystal unit LC1 and the second liquid crystal unit LC2 are not listed in detail in FIG. 1. The detailed elements of the first liquid crystal unit LC1 and the second liquid crystal unit LC2 will be described in FIG. 9 later.

In some embodiments, in the third direction D3, the second polarizer P2 is disposed on the second liquid crystal unit LC2, the first liquid crystal unit LC1 is disposed on the second polarizer P2, and the first polarizer P1 is disposed on the first liquid crystal unit LC1. In some embodiments, the first polarizer P1 and/or the second polarizer P2 may include triacetate fiber (TAC), polyvinyl alcohol (PVA), but the present disclosure is not limited thereto.

Figure 5:
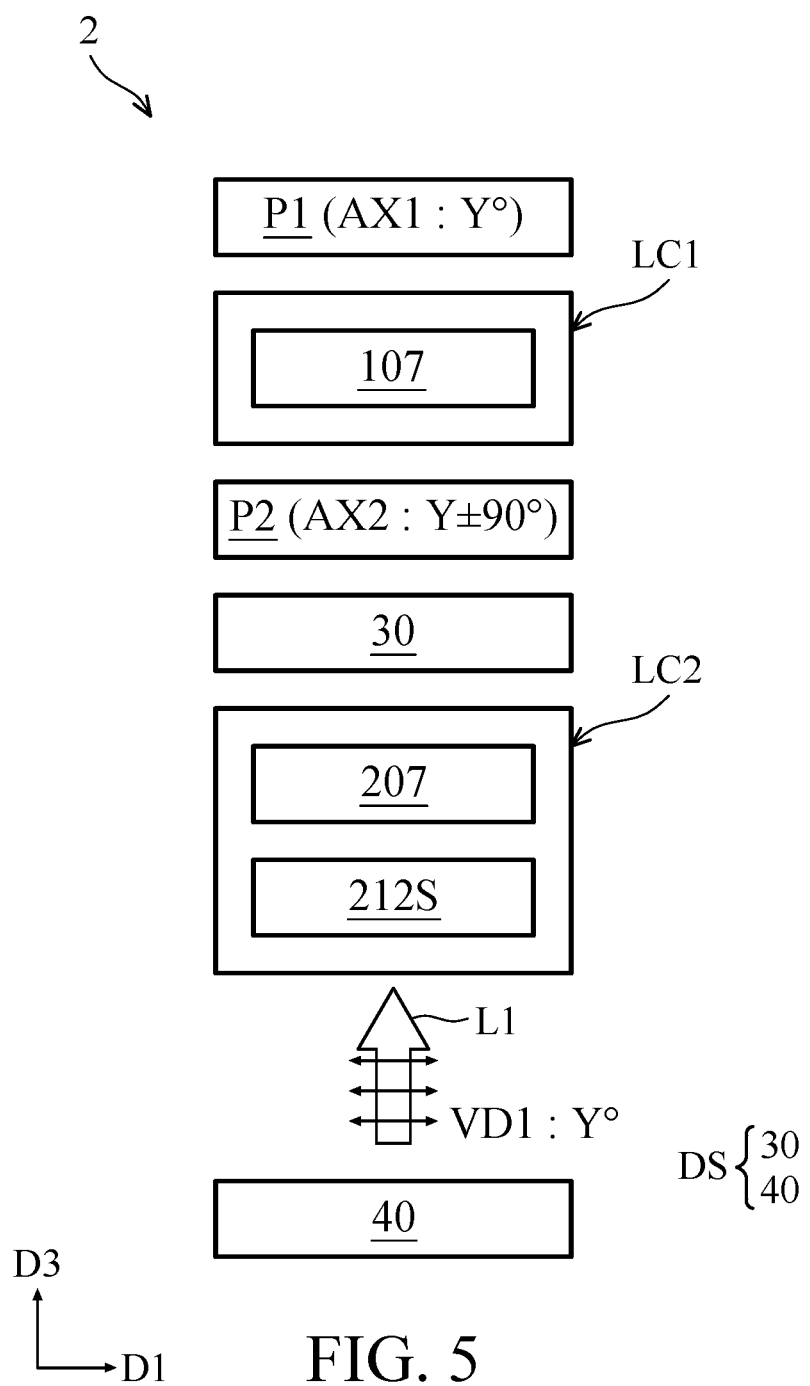
FIG. 5 is a schematic cross-sectional view of an electronic device according to some embodiments of the present disclosure.

In some embodiments, the electronic device 1 as shown in FIG. 1 may further include a display structure DS. In some embodiments, please refer to FIG. 1 and FIG. 2 at the same time, the display structure DS may be used to provide the light L0 or the first light L1, so that the light L0 or the first light L1 passes through the viewing angle switchable structure SS. According to some embodiments, the light L0 may pass through a polarizer (such as the third polarizer P3) to provide a polarized light (the first light L1). The polarized light (the first light L1) may be incident on the viewing angle switchable structure SS, for example incident on the second liquid crystal layer 207. In some embodiments, the display structure DS may include a display module 30, and the display module 30 may include a display layer. In some embodiments, the display structure DS may further include a back light module 40 to provide a light source (e.g., a back light) into the display module 30. In some embodiments, the display structure DS may be a self-luminous or non-self-luminous display structure. If the display structure DS is a self-luminous display structure, the back light module 40 may be omitted. For example, the display structure DS may include an organic light emitting diode display layer, the display structure DS may not include the back light module 40, and the display module 30 may include the organic light emitting diode display layer. According to some embodiments, when the display structure DS includes the back light module 40, the display module 30 may be a liquid crystal display panel, and the back light module 40 may provide a light source for the liquid crystal display panel. In some embodiments, as shown in FIG. 1, the first polarizer P1 is disposed between the display module 30 and the first liquid crystal unit LC1. In some embodiments, in the third direction D3, the display module 30 is disposed on the first liquid crystal unit LC1. In other embodiments, the display module 30 is disposed between the second liquid crystal unit LC2 and the back light module 40. In still other embodiments, as shown in FIG. 5, the display module 30 is disposed between the second polarizer P2 and the second liquid crystal unit LC2. According to some embodiments, the back light module 40 may directly provide the polarized light (the first light L1) without a polarizer (the third polarizer P3).

Refer to FIG. 1 in conjunction with FIG. 2, FIG. 2 is a three-dimensional schematic diagram showing the optical properties of the electronic device 1 according to some embodiments of the present disclosure. Since FIG. 2 shows a light path diagram in the electronic device 1, elements such as the substrate 212S are omitted. In some embodiments, the viewing angle switchable structure SS may include a first viewing angle switchable module 10 and a second viewing angle switchable module 20. In some embodiments, the first viewing angle switchable module 10 and the second viewing angle switchable module 20 may be regarded as privacy units, respectively.

Figure 9:
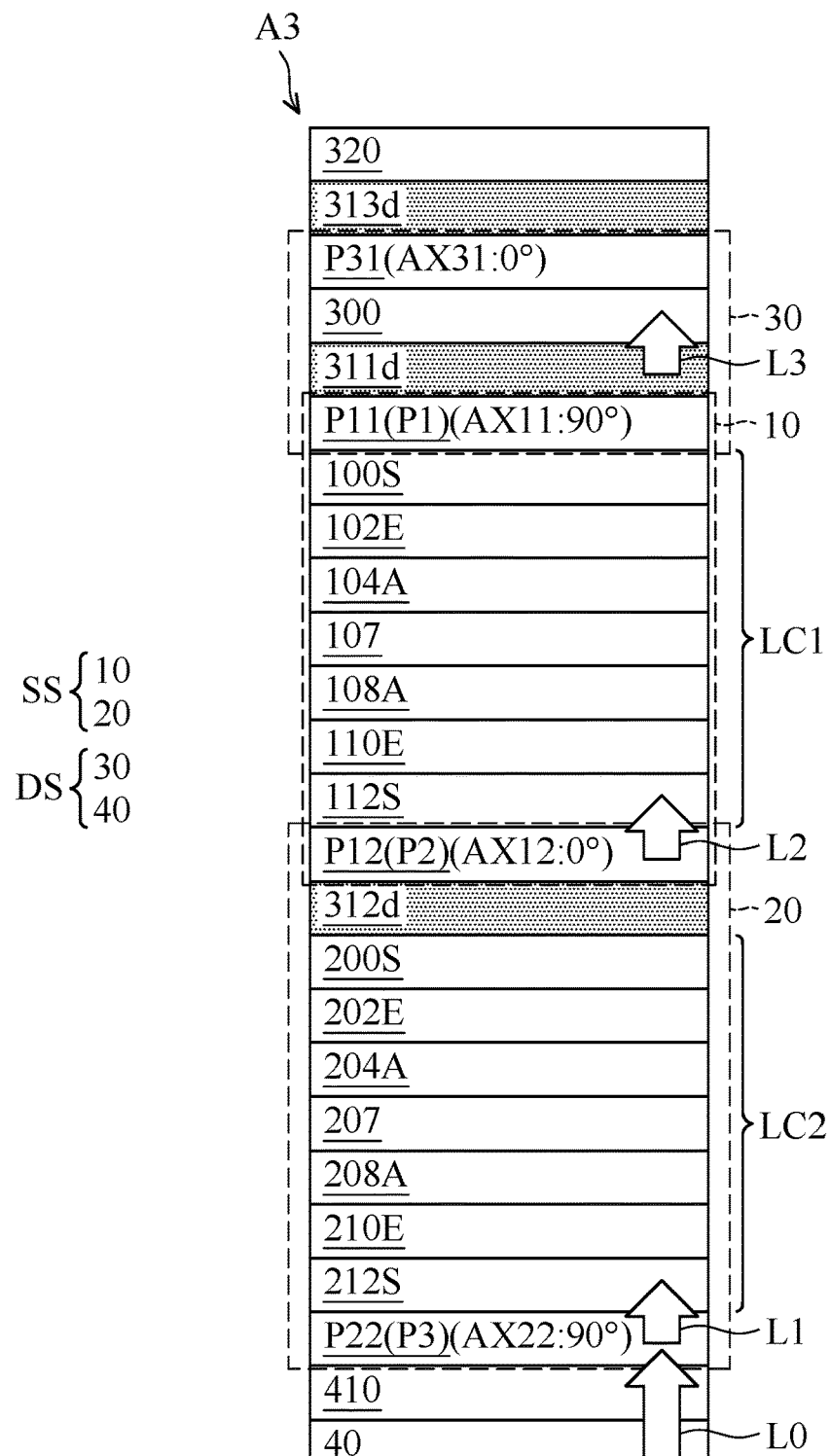

FIG. 9 shows a further detailed structure of the electronic device. In some embodiments, please refer to FIG. 2 and FIG. 9, the first viewing angle switchable module 10 may include the first polarizer P1, the second polarizer P2, and a first liquid crystal unit LC1. The first liquid crystal unit LC1 may include a first alignment layer (e.g., the first alignment layer 104A shown in FIG. 9) and a second alignment layer (e.g., the second alignment layer 108A shown in FIG. 9). Thus, the first alignment layer may have the first alignment axis AL1 and the second alignment layer may have the second alignment axis AL2. Compared to the second alignment axis AL2, the first alignment axis AL1 is closer to the first polarizer P1. In some embodiments, the first liquid crystal layer 107 in the first liquid crystal unit LC1 may include a plurality of first liquid crystal molecules. For example, the first liquid crystal molecules may be twisted nematic liquid crystal (TN) molecules. In the first liquid crystal unit LC1, the first alignment axis AL1 of the first alignment layer may be perpendicular to the second alignment axis AL2 of the second alignment layer. As shown in FIG. 9, the first liquid crystal unit LC1 may further include a first electrode 102E and a second electrode 110E disposed on both sides of the first liquid crystal layer 107, the first alignment layer 104A disposed between the first electrode 102E and the first liquid crystal layer 107, and the second alignment layer 108A disposed between the second electrode 110E and the first liquid crystal layer 107. By changing the voltage of the first electrode 102E and the second electrode 110E in the first liquid crystal unit LC1, the penetration of light to the first liquid crystal unit LC1 is changed, so that the first viewing angle switchable module 10 has the effect of switching the viewing angle. That is, by controlling the voltage, the first viewing angle switchable module 10 has a sharing mode (the large viewing angle) and a privacy mode (the small viewing angle), and the sharing mode and the privacy mode may be switched from each other.

In some embodiments, please refer to FIG. 2 and FIG. 9, the second viewing angle switchable module 20 may include a second polarizer P2 and a second liquid crystal unit LC2. The second liquid crystal unit LC2 may include a third alignment layer (e.g., the third alignment layer 204A shown in FIG. 9) and a fourth alignment layer (e.g., the fourth alignment layer 208A shown in FIG. 9). Thus, the third alignment layer may have the third alignment axis AL3 and the fourth alignment layer may have the fourth alignment axis AL4. Compared to the fourth alignment axis AL4, the third alignment axis AL3 is closer to the first polarizer P1. In some embodiments, the second liquid crystal layer 207 in the second liquid crystal unit LC2 may include a plurality of second liquid crystal molecules. For example, the second liquid crystal molecules may be twisted nematic liquid crystal (TN) molecules. In the second liquid crystal unit LC2, the third alignment axis AL3 of the third alignment layer may be perpendicular to the fourth alignment axis AL4 of the fourth alignment layer. According to some embodiments, since the first liquid crystal layer 107 and the second liquid crystal layer 207 may include twisted nematic liquid crystal molecules, the size of the privacy area may be increased. As shown in FIG. 9, the second liquid crystal unit LC2 may further include a third electrode 202E and an fourth electrode 210E disposed on both sides of the second liquid crystal layer 207, the third alignment layer 204A disposed between the third electrode 202E and the second liquid crystal layer 207, and the fourth alignment layer 208A disposed between the fourth electrode 210E and the second liquid crystal layer 207. By changing the voltage of the third electrode 202E and the fourth electrode 210E in the second liquid crystal unit LC2, the penetration of light to the second liquid crystal unit LC2 is changed, so that the second viewing angle switchable module 20 has the effect of switching the viewing angle. That is, by controlling the voltage, the second viewing angle switchable module 20 has a sharing mode (the large viewing angle) and a privacy mode (the small viewing angle), and the sharing mode and the privacy mode may be switched from each other.

Refer to FIG. 2, in some embodiments, the viewing angle switchable structure SS further includes a third polarizer P3. In some embodiments, the second liquid crystal layer 207 is disposed between the third polarizer P3 and the second polarizer P2, and the light L0 may pass through the third polarizer P3 to provide polarized light (the first light L1). In some embodiments, the material of the third polarizer P3 and the material of the first polarizer P1 and/or the second polarizer P2 may be the same or different. In some embodiments, the angle of the third absorption axis AX3 of the third polarizer P3 is the same as the angle of the first absorption axis AX1 of the first polarizer P1. In some embodiments, the angle of the first absorption axis AX1 of the first polarizer P1 is perpendicular to the polarization direction of the polarized light passing through the third polarizer P3. In other embodiments, the third polarizer P3 may be omitted. Therefore, the angle of the first absorption axis AX1 of the first polarizer P1 is perpendicular to the polarization direction of the polarized light provided by the back light module 40.

As described above, in some embodiments, the angles of the absorption axes of the first polarizer P1 and the second polarizer P2, the angles of the alignment axis of the alignment layers in the first liquid crystal unit LC1 and the second liquid crystal unit LC2, and mode and/or rotation of the first liquid crystal layer 107 and the second liquid crystal layer 207 are adjusted. Thus, the angles of the absorption axes of one of the polarizers required in respective first viewing angle switchable module 10 and the second viewing angle switchable module 20 are the same. For example, as shown in FIG. 2, a polarizer (the second polarizer P2) may be commonly used by the first viewing angle switchable module 10 and the second viewing angle switchable module 20. In this way, in the case that the optical matching (the polarization matching) may be maintained in the viewing angle switchable stack, the number of polarizers, the overall thickness of the electronic device, and/or the manufacturing cost may be reduced.

In some embodiments, as shown in FIG. 2, the first absorption axis AX1 of the first polarizer P1 is 90 degrees or 270 degrees (along the second direction D2), and the second absorption axis AX2 of the second polarizer P2 is 0 degrees or 180 degrees (along the first direction D1), and the third absorption axis AX3 of the third polarizer P3 is 90 degrees or 270 degrees (along the second direction D2). In the first liquid crystal unit LC1, the first alignment axis AL1 is 90 degrees, the second alignment axis AL2 is 180 degrees, and the first liquid crystal layer 107 is an O mode left-handed liquid crystal layer. In the second liquid crystal unit LC2, the third alignment axis AL3 is 90 degrees, the fourth alignment axis AL4 is 180 degrees, and the second liquid crystal layer 207 is an E mode left-handed liquid crystal layer.

In detail, as shown in FIG. 2, the light L0 is provided to the third polarizer P3 to obtain the first light L1 with the first polarization direction VD1 of 0 degrees or 180 degrees (along the first direction D1). Then, the first light L1 is incident on the second liquid crystal unit LC2 having the fourth alignment axis AL4 and the third alignment axis AL3, and the second liquid crystal layer 207 turns the first light L1 into a second light L2. Wherein, the second polarization direction VD2 of the second light L2 is 90 degrees or 270 degrees (along the second direction D2), so the first polarization direction VD1 of the first light L1 may be perpendicular to the second polarization direction VD2 of the second light L2.

Next, the second light L2 passes through the second polarizer P2, then is incident on the first liquid crystal unit LC1 having the second alignment axis AL2 and the first alignment axis AL1. The second light L2 is turned into the third light L3 by the first liquid crystal layer 107. Wherein, the third polarization direction VD3 of the third light L3 is 0 degrees or 180 degrees (along the first direction D1). That is, the second polarization direction VD2 of the second light L2 may be perpendicular to the third polarization direction VD3 of the third light L3. After that, the third light L3 is emitted through the first polarizer P1. Therefore, in an initial state without an external electric field, the light may pass through the electronic device 1, so the electronic device 1 is in a normally white state.

Refer to FIG. 2, the first viewing angle switchable module 10 and the second viewing angle switchable module 20 in the electronic device 1 share the second polarizer P2, and the angle of the first absorption axis AX1 of the first polarizer P1 is perpendicular to the first polarization direction VD1 of the first light L1. In the prior art, in the case of using two privacy modules, in order to achieve the polarization matching in the stacked structure, more than one polarizer may be required between the two liquid crystal units. For example, two polarizers and one half-wave plate may be required between the two liquid crystal units. Compared with the prior art, in some embodiments of the present disclosure, one polarizer (i.e., the second polarizer P2) needs to be disposed between the first liquid crystal unit LC1 and the second liquid crystal unit LC2. In this way, in the case that the optical matching (the polarization matching) may be maintained in the viewing angle switchable stack, the number of polarizers, the overall thickness of the electronic device, and/or the manufacturing cost may be reduced. In addition, since the electronic device 1 includes two viewing angle switchable modules (the first viewing angle switchable module 10 and the second viewing angle switchable module 20), it provides a great privacy effect.

In some embodiments, the back light module 40 may be a non-collimated back light module. Therefore, the present disclosure may improve the privacy effect such as the size of the privacy area and/or the privacy capability when the non-collimated back light module is used, so the embodiments of the present disclosure may be applied in vehicle privacy panel with a non-collimated back light module 40 therein. In detail, when the light transmittance of the displayed picture is sufficiently low, the displayed picture may not be seen by human eyes, so it may be regarded as having a privacy effect. Compared with the collimated back light module, the non-collimated back light module has lower privacy capability in large viewing angle area, for example, the light transmittance may not be low enough, and so the displayed picture may still be seen. However, the vehicle privacy panel is limited by the regulations of the sharing mode that the vehicle privacy panel needs to use a non-collimated back light module, so the privacy capability of the vehicle privacy panel is limited. In addition, when the size of the display panel increases, the size of the area with the privacy capability is insufficient, so that the privacy failure problem occurs in some areas of the display panel. However, the embodiment of the present disclosure may maintain the privacy effect when the non-collimated back light module is used.

Figure 3:
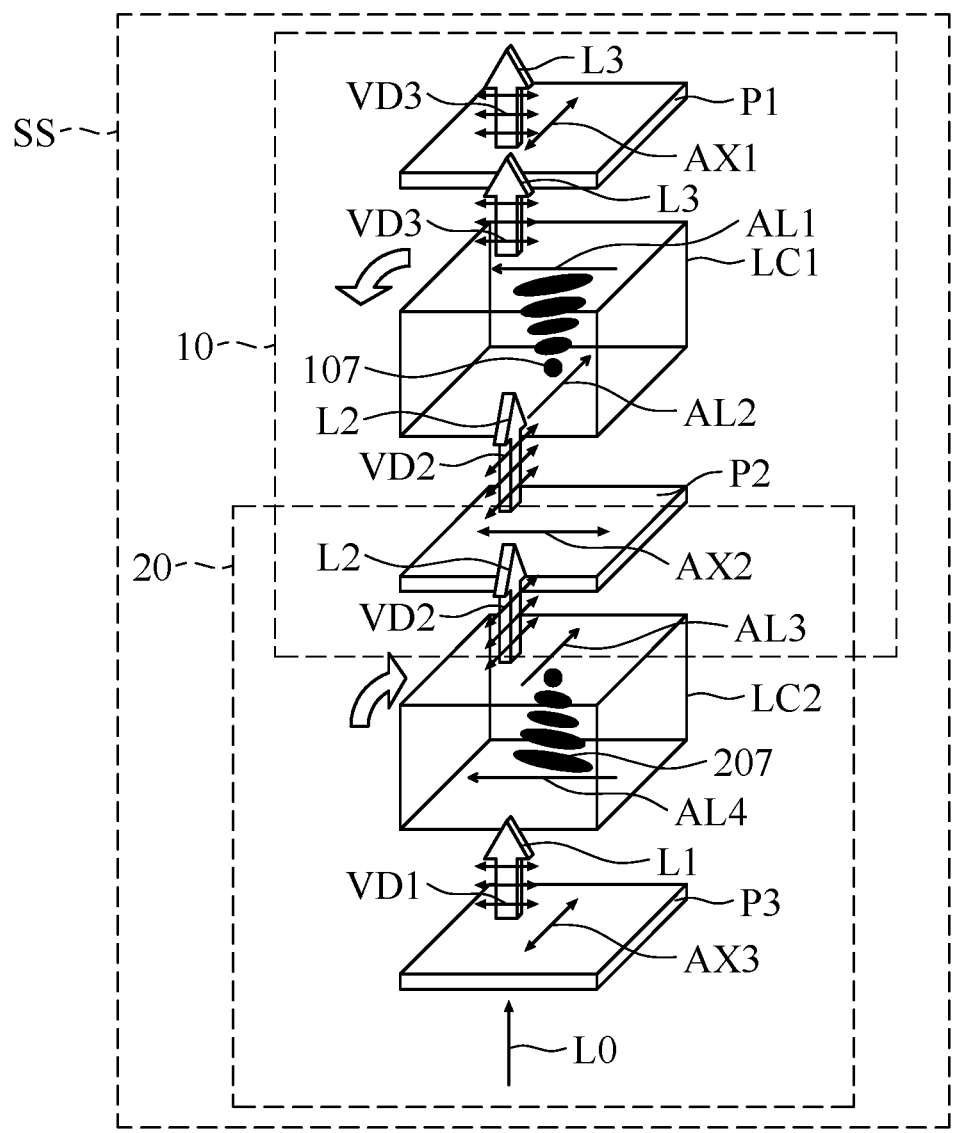

Refer to FIG. 3, FIG. 3 is a three-dimensional schematic diagram showing the optical properties of the electronic device 1 according to other embodiments of the present disclosure. Similarly, since FIG. 3 shows a light path diagram in the electronic device 1, elements such as the substrate 212S are omitted. As shown in FIG. 3, in the first liquid crystal unit LC1, the first alignment axis AL1 is 180 degrees, the second alignment axis AL2 is 90 degrees, and the first liquid crystal layer 107 is an E mode right-handed liquid crystal layer. In the second liquid crystal unit LC2, the third alignment axis AL3 is 90 degrees, the fourth alignment axis AL4 is 180 degrees, and the second liquid crystal layer 207 is an E mode left-handed liquid crystal layer.

Figure 4:
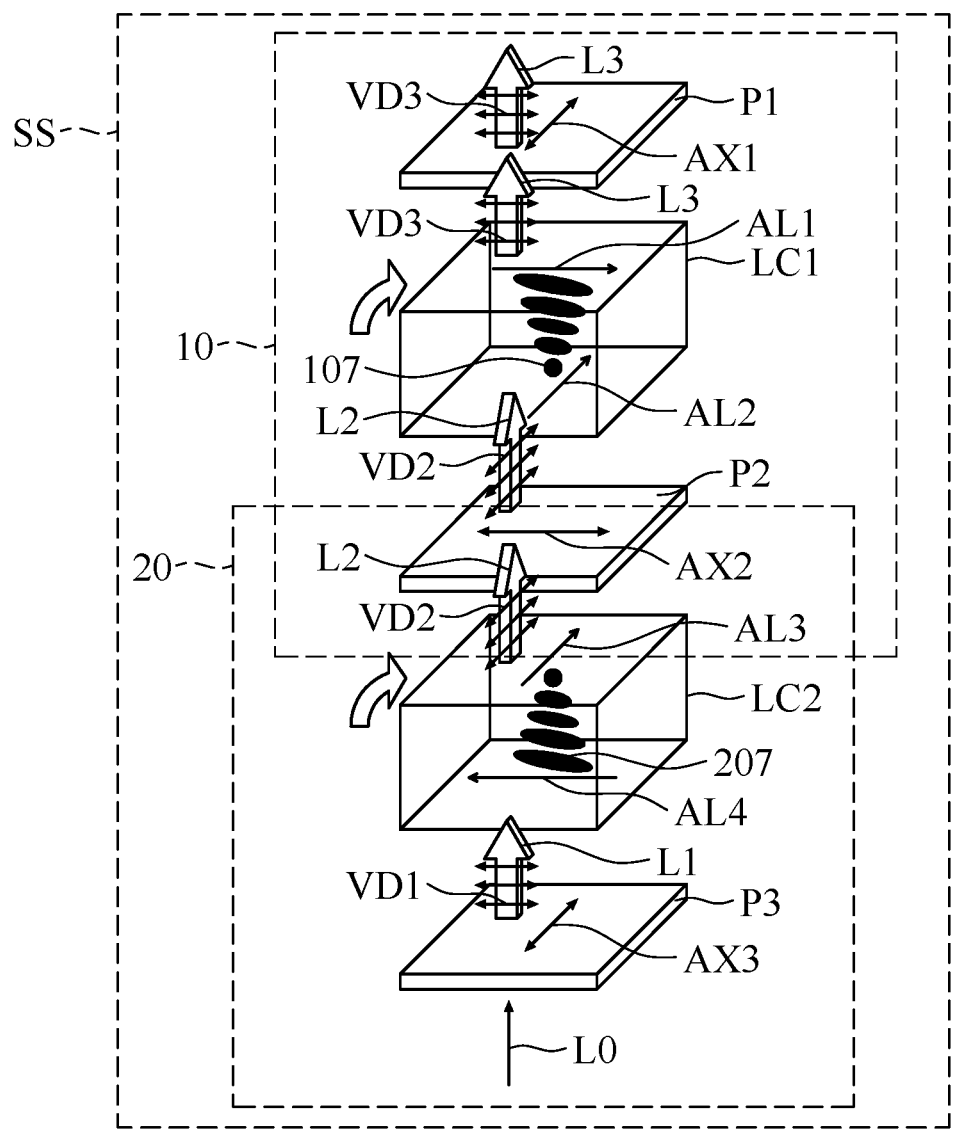

Refer to FIG. 4, FIG. 4 is a three-dimensional schematic diagram showing the optical properties of the electronic device 1 according to other embodiments of the present disclosure. Similarly, since FIG. 4 shows a light path diagram in the electronic device 1, elements such as the substrate 212S are omitted. As shown in FIG. 4, in the first liquid crystal unit LC1, the first alignment axis AL1 is 0 degrees, the second alignment axis AL2 is 90 degrees, and the first liquid crystal layer 107 is an E mode left-handed liquid crystal layer. In the second liquid crystal unit LC2, the third alignment axis AL3 is 90 degrees, the fourth alignment axis AL4 is 180 degrees, and the second liquid crystal layer 207 is an E mode left-handed liquid crystal layer.

As shown in FIGS. 2 to 4, in some embodiments, based on the characteristics of the first liquid crystal layer 107 and the second liquid crystal layer 207 that may change the direction of the light, the electronic device has a privacy range which is a widest angle range formed by the angles of the first alignment axis to the fourth alignment axis. In some embodiments, the maximum difference between the angle of the first alignment axis AL1 or the second alignment axis AL2 of the first liquid crystal unit LC1 and the angle of the third alignment axis AL3 or the fourth alignment axis AL4 of the second liquid crystal unit LC2 is 90 degrees. Therefore, the electronic device may provide a privacy effect with an angle range of 90 degrees. In some embodiments, the maximum difference between the angle of the first alignment axis AL1 or the second alignment axis AL2 of the first liquid crystal unit LC1 and the angle of the third alignment axis AL3 or the fourth alignment axis AL4 of the second liquid crystal unit LC2 is 180 degree. Therefore, the electronic device may provide a privacy effect with an angle range of 180 degrees. According to some embodiments, the first liquid crystal layer 107 may be O mode or E mode, and may be left-handed or right-handed. The second liquid crystal layer 207 may be O mode or E mode, and may be left-handed or right-handed. The O/E mode and left/right-handed of the first liquid crystal layer 107 and the second liquid crystal layer 207 may be combined according to product requirements, but the present disclosure is not limited thereto.

In some embodiments, as shown in FIG. 2, in the electronic device 1, the first alignment axis AL1 is 90 degrees, the second alignment axis AL2 is 180 degrees, the third alignment axis AL3 is 90 degrees, and the fourth alignment axis AL4 is 180 degrees. Therefore, the widest angle range formed by the angles of the first alignment axis AL1 to the fourth alignment axis AL4 is 90 degrees to 180 degrees. Thus, the electronic device 1 provides a privacy effect between 90 degrees and 180 degrees. In addition, since the upper viewing angle is corresponding to the lower viewing angle, the privacy effect between 90 degrees and 180 degrees may be regarded as a single-sided privacy effect on the left side of the electronic device 1. Similarly, if the electronic device provide a privacy effect between 0 degrees and 90 degrees, the privacy effect may be regarded as a single-sided privacy effect on the right side of the electronic device 1. In other embodiments, as shown in FIG. 4, the widest angle range formed by the angles of the first alignment axis AL1 to the fourth alignment axis AL4 of the electronic device 1 is 0 degrees to 180 degrees. Therefore, the electronic device 1 has a privacy effect between 0 degrees and 180 degrees, and the privacy effect may be regarded as a double-sided privacy effect.

Continuing, the angles, alignment axis directions, modes, and/or rotations of the elements of the electronic device 1 of the present disclosure are not limited to the above specific parameters, and the parameters of other examples (for example, Examples 1 to 16) are listed in Table 1 and Table 2, but the present disclosure is not limited thereto. In some embodiments, based on Table 1 and Table 2, if the parameters of one of the first liquid crystal unit LC1 and the second liquid crystal unit LC2 are fixed, the parameters of the other of the first liquid crystal unit LC1 and the second liquid crystal unit LC2 may be changed to achieve the single-sided privacy effect. In some embodiments, based on Table 1 and Table 2, the angle range of privacy effect may be adjusted by changing modes and/or rotations of the liquid crystal units.

Table 1 shows the parameters of Example 1 to Example 8. Example 1 to Example 4 are parameters of an electronic device with single-sided (e.g., the right-sided) privacy effect of 0 degrees to 90 degrees. Example 5 to Example 8 are parameters of an electronic device with single-sided (e.g., the left-sided) privacy effect of 90 degrees to 180 degrees. The parameters of Example 5 and Example 6 are shown in the electronic devices in FIGS. 2 and 3, respectively.

TABLE 1

| Example | | 1 | 2 | 3 | 4 | 5 | 6 | 7 | 8 |
|---|---|---|---|---|---|---|---|---|---|
| first absorption axis AX1 | | \multicolumn{8}{c}{90 degrees (270 degrees)} | | | | | | | |
| first liquid crystal unit LC1 | first alignment axis AL1 | 90° | 0° | 0° | 90° | 90° | 180° | 180° | 90° |
| | first liquid crystal layer 107 | O mode right-handed | E mode left-handed | E mode left-handed | O mode right-handed | O mode left-handed | E mode right-handed | E mode right-handed | O mode left-handed |
| | second alignment axis AL2 | 0° | 90° | 90° | 0° | 180° | 90° | 90° | 180° |
| second absorption axis AX2 | | \multicolumn{8}{c}{0 degrees (180 degrees)} | | | | | | | |
| second liquid crystal unit LC2 | third alignment axis AL3 | 90° | 90° | 0° | 0° | 90° | 90° | 180° | 180° |
| | second liquid crystal layer 207 | E mode right-handed | E mode right-handed | O mode left-handed | O mode left-handed | E mode left-handed | E mode left-handed | 0 mode right-handed | 0 mode right-handed |
| | fourth alignment axis AL4 | 0° | 0° | 90° | 90° | 180° | 180° | 90° | 90° |
| third absorption axis AX3 | | \multicolumn{8}{c}{90 degrees (270 degrees)} | | | | | | | |

As shown in Table 1, in some embodiments, the angle of the first alignment axis AL1 and the angle of the third alignment axis AL3 may be the same, or the difference between the angle of the first alignment axis AL1 and the angle of the third alignment axis AL3 is 180 degrees (or parallel). It means that the first liquid crystal layer 107 and the second liquid crystal layer 207 may have different modes. For example, the first liquid crystal layer 107 is one of E mode and O mode, and the second liquid crystal layer 207 is the other of E mode and O mode. In some embodiments, the difference between the first alignment axis AL1 and the third alignment axis AL3 is 90 degrees (or perpendicular). It means that the first liquid crystal layer 107 and the second liquid crystal layer 207 may have the same mode. For example, both the first liquid crystal layer 107 and the second liquid crystal layer 207 are E mode, or both are O mode.

Table 2 shows the parameters of Example 9 to Example 16. Example 9 to Example 16 are the parameters of the electronic device with double-sided privacy effect of 0 degrees to 180 degrees. Wherein Example 9 to Example 12 show parameters that the first liquid crystal unit LC1 provides single-sided (e.g., the right-sided) privacy effect of 0 degrees to 90 degrees, and the second liquid crystal unit LC2 provides single-sided (e.g., the left-sided) privacy effect of 90 degrees to 180 degrees. Example 13 to Example 16 show parameters that the first liquid crystal unit LC1 provides single-sided (e.g., the left-sided) privacy effect of 90 degrees to 180 degrees, and the second liquid crystal unit LC2 provides single-sided (e.g., the right-sided) privacy effect of 0 degrees to 90 degrees. The parameter of Example 9 is shown in the electronic device in FIG. 4.

degrees"). The angle of the second absorption axis AX2 of the polarizer P2 may be "b+90 degrees" (may also be "b+270 degrees"). Wherein, "b" may be any value greater than or equal to 0 to less than or equal to 360 ($0 \leq b \leq 360$). Next, the privacy range of the electronic device may be a single-sided privacy from "b degrees" to "b+90 degrees", or may be a double-sided privacy from "b degrees" to "b+180 degrees". Then, appropriate first liquid crystal layer 107 and second liquid crystal layer 207 are selected. For example, the angle of the first absorption axis AX1 of the first polarizer P1 and the angle of the third absorption axis AX3 of the third polarizer P3 may be 135 degrees (315 degrees). The angle of the second absorption axis AX2 of the second polarizer P2 may be 45 degrees (225 degrees). Thus, different privacy effects such as a single-sided privacy from 45 degrees to 135 degrees or a double-sided privacy from 45 degrees to 225 degrees may be obtained. Therefore, according to some embodiments, the single-sided privacy or the double-sided privacy may be achieved by adjusting the mode (E mode or O mode) and/or the rotation (the left-handed or the right-handed) of the liquid crystal units.

In some embodiments, the viewing angle switchable structure SS may be selected to be active or inactive, to switch the privacy mode and the share mode of the electronic device. In some embodiments, the first viewing angle switchable module 10 and the second viewing angle switchable module 20 of the viewing angle switchable structure SS in the electronic device may be independently controlled, so the first viewing angle switchable module 10 or the second viewing angle switchable module 20 may be active independently. Therefore, according to some embodiments, by independently activating the first viewing angle switch-

TABLE 2

| | Example | 9 | 10 | 11 | 12 | 13 | 14 | 15 | 16 |
|---|---|---|---|---|---|---|---|---|---|
| first absorption axis AX1 | | 90 degrees (270 degrees) | | | | | | | |
| first liquid crystal unit LC1 | first alignment axis AL1 | 0° | 90° | 90° | 0° | 180° | 90° | 90° | 180° |
| | first liquid crystal layer 107 | E mode left-handed | O mode right-handed | O mode right-handed | E mode left-handed | E mode right-handed | O mode left-handed | O mode left-handed | E mode right-handed |
| | second alignment axis AL2 | 90° | 0° | 0° | 90° | 90° | 180° | 180° | 90° |
| second absorption axis AX2 | | 0 degrees (180 degrees) | | | | | | | |
| second liquid crystal unit LC2 | third alignment axis AL3 | 90° | 90° | 180° | 180° | 90° | 90° | 0° | 0° |
| | second liquid crystal layer 207 | E mode left-handed | E mode left-handed | O mode right-handed | O mode right-handed | E mode right-handed | E mode right-handed | O mode left-handed | O mode left-handed |
| | fourth alignment axis AL4 | 180° | 180° | 90° | 90° | 0° | 0° | 90° | 90° |
| third absorption axis AX3 | | 90 degrees (270 degrees) | | | | | | | |

Similar to Table 1, for example, the first liquid crystal layer 107 may be one of E mode and O mode, and the second liquid crystal layer 207 may be the other of E mode and O mode. For example, both the first liquid crystal layer 107 and the second liquid crystal layer 207 may be E mode, or may be O mode.

In some embodiments, in the electronic device, the angle of the first absorption axis AXM of the first polarizer P1 and the angle of the third absorption axis AX3 of the third polarizer P3 may be "b degrees" (may also be "b+180 able module 10 or the second viewing angle switchable module 20 in the electronic device with double-sided privacy effect, the single-sided privacy effect may be achieved.

In the following, the same or similar reference numerals will not be repeated.

Refer to FIG. 5, FIG. 5 is a schematic three-dimensional cross-sectional view of an electronic device 2 according to some embodiments of the present disclosure. In some embodiments, the electronic device 2 includes a viewing angle switchable structure SS and a display structure DS, and the display structure DS includes a back light module 40 and a display module 30. The viewing angle switchable structure SS includes a first polarizer P1, a second polarizer P2, a first liquid crystal layer 107, a second liquid crystal layer 207, and a substrate 212S. In some embodiments, the display module 30 is disposed between the first liquid crystal unit LC1 and the second liquid crystal unit LC2. In some embodiments, in the third direction D3, the second liquid crystal unit LC2 is disposed on the back light module 40, and the display module 30 is disposed on the second liquid crystal unit LC2. The second polarizer P2 is disposed on the display module 30, the first liquid crystal unit LC1 is disposed on the second polarizer P2, and the first polarizer P1 is disposed on the first liquid crystal unit LC1. The first liquid crystal unit LC1 includes a first liquid crystal layer 107, and the second liquid crystal unit LC2 includes a second liquid crystal layer 207 and a substrate 212S. The first liquid crystal layer 107 is disposed between the first polarizer P1 and the second polarizer P2, the display module 30 is disposed between the second polarizer P2 and the second liquid crystal layer 207, and the second liquid crystal layer 207 is disposed between the display module 30 and the substrate 212S.

As shown in FIG. 5, the polarized light (the first light L1) is incident on the second liquid crystal layer 207. The angle of the first absorption axis AX1 of the first polarizer P1 is the same as the polarization direction (the first polarization direction VD1) of the polarized light (the first light L1). For example, the first absorption axis AX1 of the first polarizer P1 is "Y degrees" and the first polarization direction VD1 is Y degrees. According to some embodiments, although not shown, the polarized light (the first light L1) in FIG. 5 may be provided by light L0 passing through the third polarizer P3. Please refer to FIG. 2. In order to obtain the first light L1 with the first polarization direction VD1 of "Y degrees", the third absorption axis AX3 of the used third polarizer P3 may be perpendicular to the first polarization direction VD1. Therefore, the second absorption axis AX2 of the second polarizer P2 and the third absorption axis AX3 of the third polarizer P3 may have the same angle.

FIGS. 6 to 9 are schematic cross-sectional views of electronic devices A1 to A4, B1 to B4, and C1 to C4 according to some embodiments of the present disclosure, respectively. The electronic devices A1 to A4 and B1 to B4 correspond to the electronic device 1 shown in FIG. 1, and the electronic devices C1 to C4 correspond to the electronic device 2 shown in FIG. 5. In the electronic device, the first liquid crystal unit LC1, the second liquid crystal unit LC2 and/or the display layer 300 may be respectively disposed between two polarizers. Taking the electronic device A1 in FIG. 6 as an example, the display module 30 may include an upper display polarizer P31, a display layer 300 and a lower display polarizer P32 that are sequentially disposed. For example, the display layer 300 may be a liquid crystal layer.

In the present disclosure, two adjacent polarizers may be shared, so one of the two adjacent polarizers may be omitted to reduce the overall thickness of the electronic device. In the present disclosure, two adjacent polarizers mean that there is no liquid crystal unit between the two polarizers. In FIGS. 6 to 9, schematic cross-sectional views illustrating examples in which one of the two adjacent polarizers is omitted.

Figure 6:
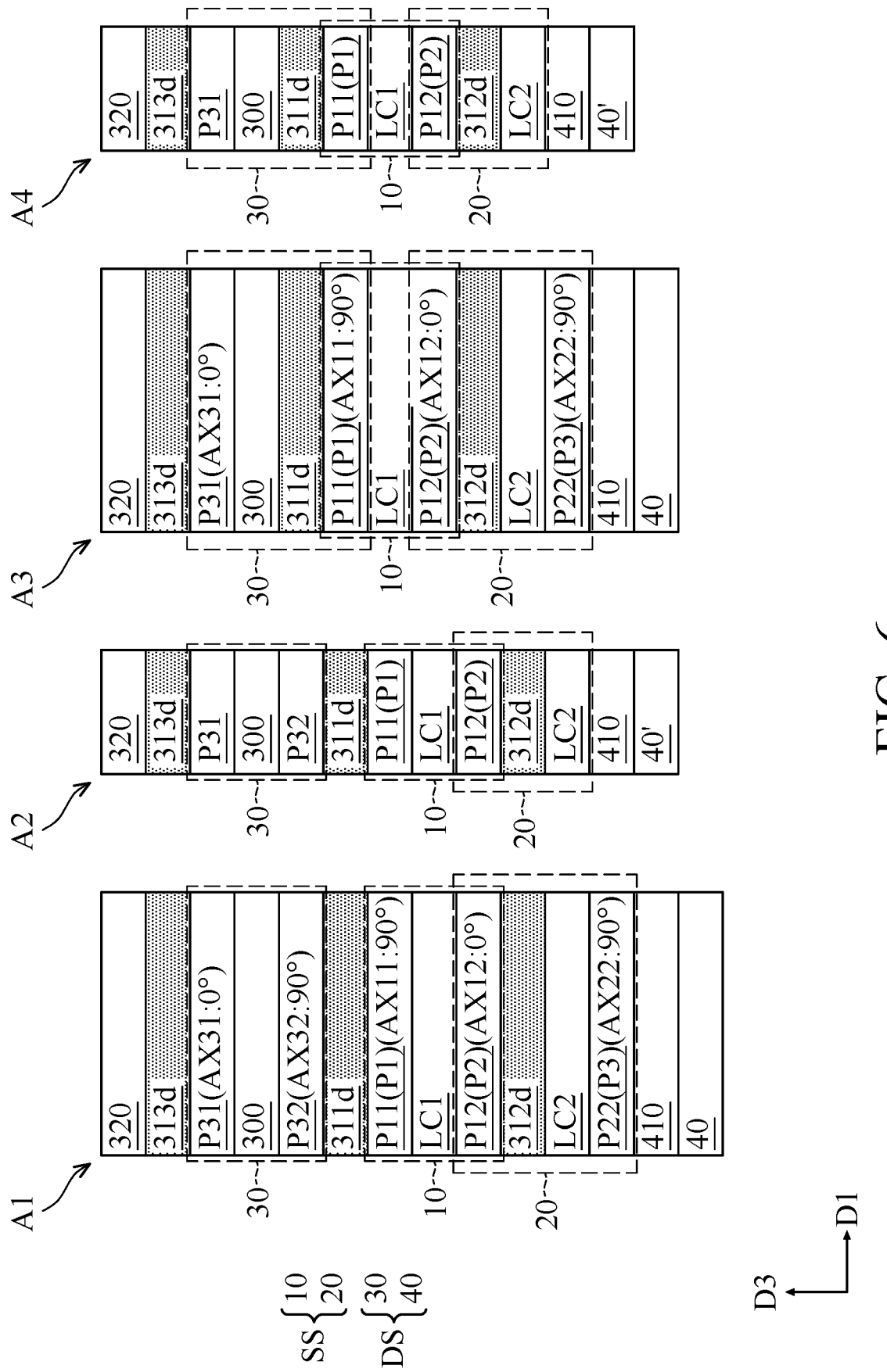
FIGS. 6 to 9 are respectively schematic cross-sectional views of electronic devices according to some embodiments of the present disclosure.

Refer to FIG. 6, specifically, in the third direction D3, in the electronic devices A1 to A4, the display module 30 is disposed above the viewing angle switchable structure SS. As shown in the electronic device A1 in FIG. 6, and in conjugation with the aforementioned related descriptions of the electronic device 1 in FIGS. 1 and 2, the first viewing angle switchable module 10 and the second viewing angle switchable module 20 may share the first lower polarizer P12 (the second polarizer P2). In the electronic device A1, the first upper polarizer P11 may serve as the first polarizer P1 as shown in FIG. 1, and the second lower polarizer P22 may serve as the third polarizer P3 as shown in FIG. 2. The angles, alignment axis directions, modes, and/or rotations of each element of the electronic device A1 may be combined with the contents of Table 1 and/or Table 2. For example, the electronic device A1 may correspond to FIG. 2 (corresponding to Example 5 of Table 1). Wherein, the absorption axis AX11 (the first absorption axis AX1) of the first polarizer P1 is 90 degrees (270 degrees), the absorption axis AX12 (the second absorption axis AX2) of the second polarizer P2 is 0 degrees (180 degrees), and the absorption axis AX22 (the third absorption axis AX3) of the second lower polarizer P22 (the third polarizer P3) is 90 degrees (270 degrees), but the present disclosure is not limited thereto. In addition, the absorption axis AX31 of the upper display polarizer P31 may be 0 degrees (180 degrees), and the absorption axis AX32 of the lower display polarizer P32 may be 90 degrees (270 degrees).

Refer to the electronic device A1 in FIG. 6, the first viewing angle switchable module 10 and the second viewing angle switchable module 20 may refer to the abovementioned related descriptions, and will not be repeated here. Wherein, when the mantissa of the reference numeral of an element is "d", it is represented that the element is as an intermediate layer, such as a connection layer or an adhesive. For example, by the adhesive (the intermediate layer 312*d*), the second polarizer P2 in the first viewing angle switchable module 10 may be bonded to the second liquid crystal unit LC2, such as the upper substrate 200S in the second liquid crystal unit LC2 (see FIG. 9). The lower display polarizer P32 in the display module 30 may be bonded with the first polarizer P1 in the first viewing angle switchable module 10 by the adhesive (the intermediate layer 311*d*).

Refer to FIG. 6, in some embodiments, as shown in electronic device A1, since the lower display polarizer P32 in the display module 30 and the first polarizer P1 in the first viewing angle switchable module 10 have the same absorption axis angle, the lower display polarizer P32 or the first polarizer P1 may be further omitted. Therefore, as shown in electronic device A3, the lower display polarizer P32 in the display module 30 may be omitted, and the first polarizer P1 in the first viewing angle switchable module 10 may function as the lower display polarizer in the display module 30 at the same time. Thus, one polarizer may be omitted. That is, the display module 30 and the first viewing angle switchable module 10 may share the same first upper polarizer P11 (the first polarizer P1). In the electronic device A3, the lower substrate (not shown) in the display module 30 may be directly bonded with the first upper polarizer P11 (the first polarizer P1) in the first viewing angle switchable module 10 by the adhesive (the intermediate layer 311*d*). In this way, the number of polarizers, the overall thickness of the electronic device, and/or the manufacturing cost may be reduced.

In some embodiments, the polarizer adjacent to the back light module 40 may be further omitted. Therefore, as shown in the electronic devices A2 and A4, since the back light module 40' may emit polarized light corresponding to the light passing through the second lower polarizer P22, the second lower polarizer P22 is further omitted. Similarly, the angles, alignment axis directions, modes, and/or rotations of each element in the electronic devices A2 to A4 shown in FIG. 6 may also be combined with the contents of Table 1 and/or Table 2.

Figure 7:
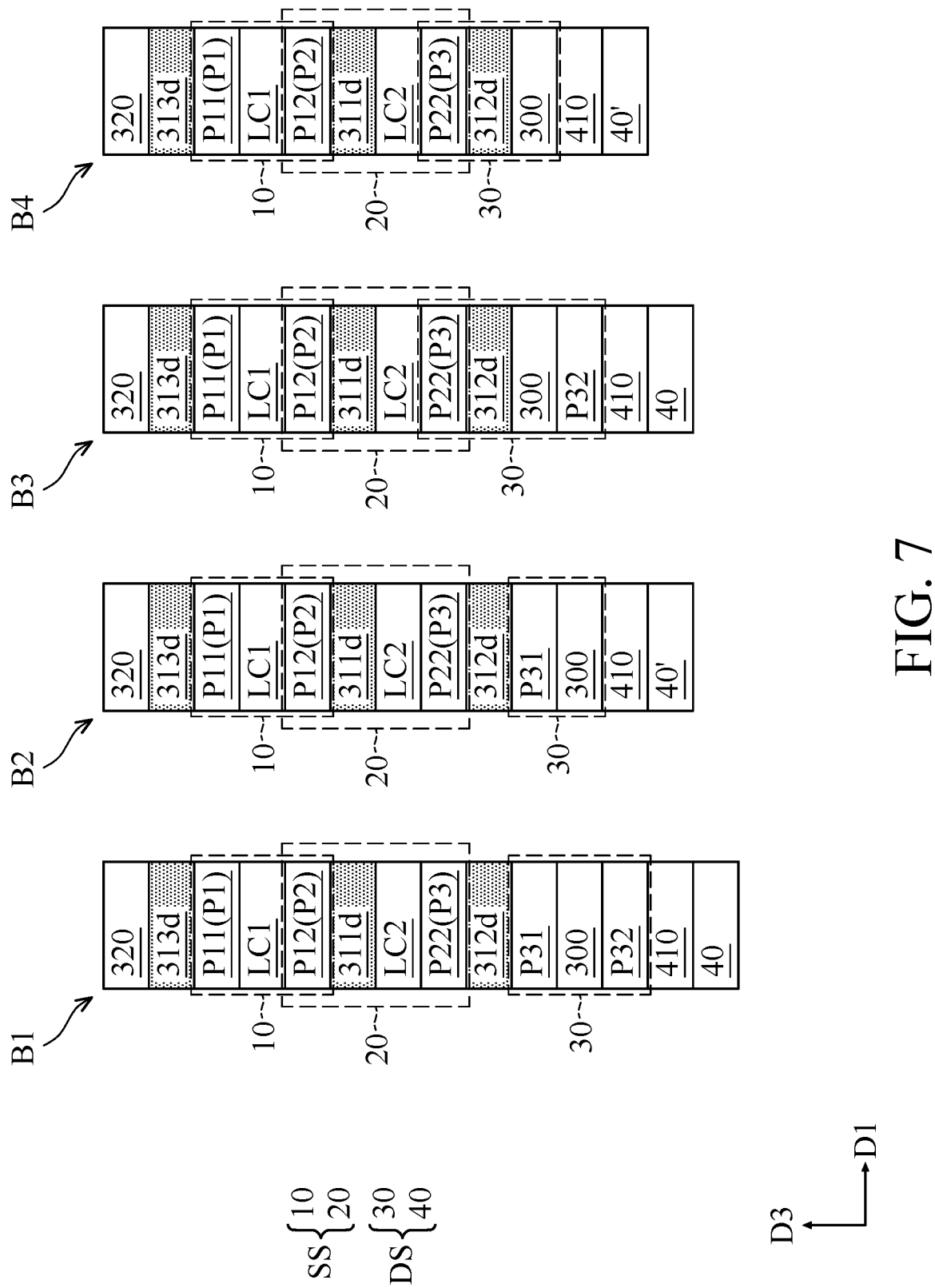

Refer to FIG. 7, specifically, in the third direction D3, in the electronic devices B1 to B4, the display module 30 is disposed below the viewing angle switchable structure SS. Similarly, as shown in the electronic device B1 in FIG. 7, the first upper polarizer P11 serves as the first polarizer P1 as shown in FIG. 1, and the first lower polarizer P12 serves as the second polarizer P2 as shown in FIG. 1, and the second lower polarizer P22 may be serves as the third polarizer P3 shown in FIG. 2. In addition, the electronic devices B2 to B4 of FIG. 7 are similar to the electronic devices A2 to A4 of FIG. 6. Furthermore, the angles, alignment axis directions, modes, and/or rotations of each element in the electronic devices B1 to B4 shown in FIG. 7 may also be combined with the contents of Table 1 and/or Table 2.

Refer to the electronic device B1 in FIG. 7, the first viewing angle switchable module 10 and the second viewing angle switchable module 20 may refer to the abovementioned related descriptions, and will not be repeated here. Wherein, when the mantissa of the reference numeral of an element is "d", it is represented that the element is as an intermediate layer, such as an adhesive. For example, the third polarizer P3 in the second viewing angle switchable module 20 may be bonded to the upper display polarizer P31 in the display module 30 by an adhesive (the intermediate layer 312d). As shown in electronic device B1, since the upper display polarizer P31 in the display module 30 and the third polarizer P3 in the second viewing angle switchable module 20 have the same absorption axis angle, the upper display polarizer P31 or the third polarizer P3 may be further omitted. Therefore, as shown in electronic device B3, the upper display polarizer P31 in the display module 30 may be omitted, and the third polarizer P3 in the second viewing angle switchable module 20 may function as the upper display polarizer in the display module 30 at the same time. That is, the display module 30 and the second viewing angle switchable module 20 may share the same third polarizer P3. In the electronic device B3, the upper substrate (not shown) in the display module 30 may be directly bonded to the third polarizer P3 in the second viewing angle switchable module 20 by adhesive (the intermediate layer 312d).

Figure 8:
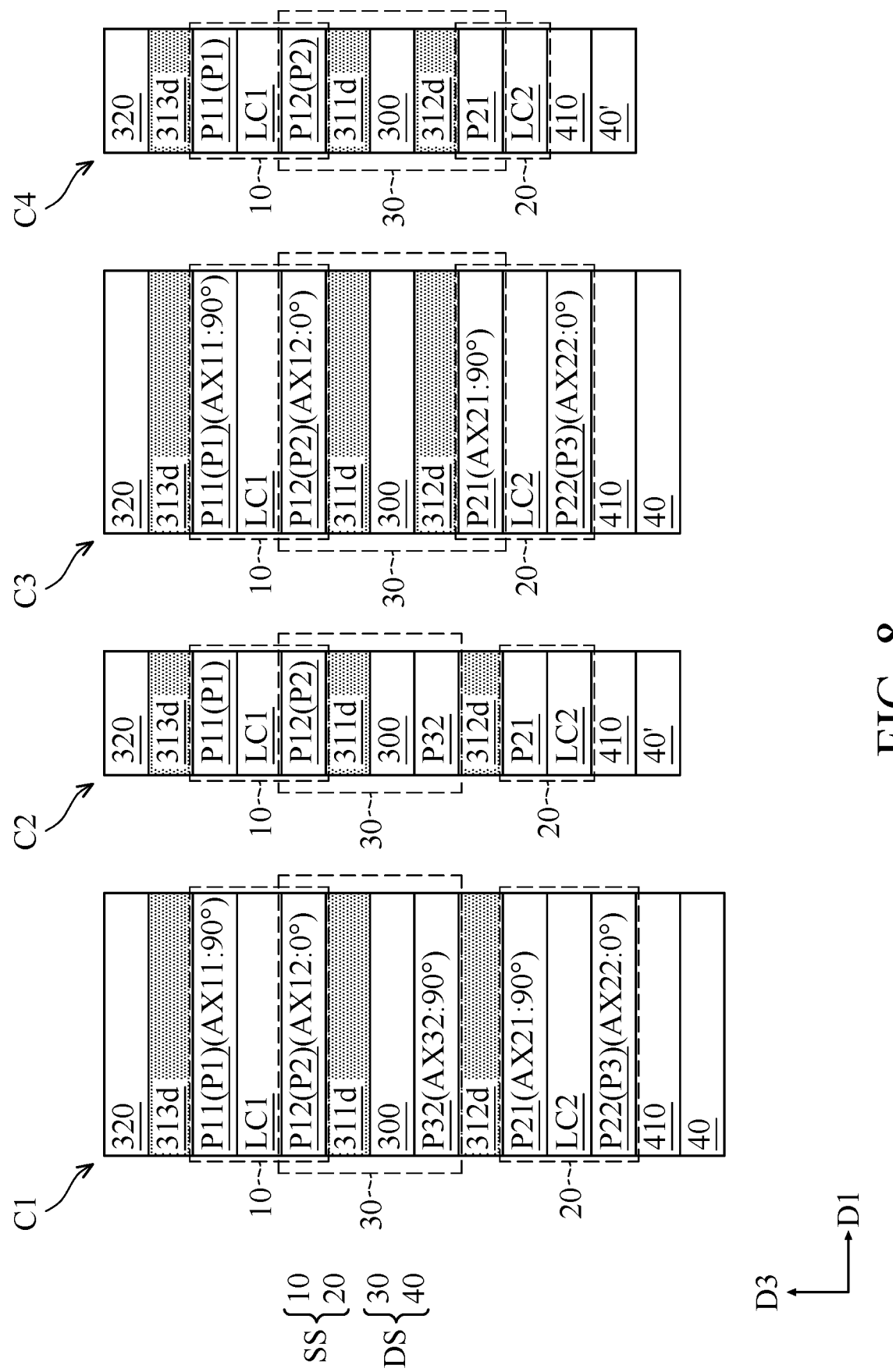

Refer to FIG. 8, the electronic devices C1 to C4 are corresponding to electronic device 2 shown in FIG. 5. Specifically, in the third direction D3, in the electronic devices C1 to C4, the display module 30 is disposed in the viewing angle switchable structure SS. In the electronic device C1, the first upper polarizer P11 serves as the first polarizer P1 as shown in FIG. 1, the first lower polarizer P12 serves as the second polarizer P2 as shown in FIG. 1, and the second lower polarizer P22 serves as the third polarizer P3 shown in FIG. 2. As shown in the electronic device C1 in FIG. 8, since the first lower polarizer P12 (the second polarizer P2) of the first viewing angle switchable module 10 may also be used as the upper display polarizer P31 of the display module 30, the upper display polarizer P31 of the display module 30 may be omitted. In the electronic device C1, the upper substrate (not shown) of the display module 30 may be directly bonded to the second polarizer P2 of the first viewing angle switchable module 10 by the adhesive (the intermediate layer 311d). In some embodiments of the present disclosure, as shown in the electronic device C1 in FIG. 8, one polarizer (i.e., the second polarizer P2) needs to be disposed between the first liquid crystal unit LC1 and the display layer 300 of the display module 30.

In some embodiments, the lower display polarizer P32 in the display module 30 may be further omitted. Therefore, as shown in the electronic device C3, since the second upper polarizer P21 in the second viewing angle switchable module 20 may also be used as the lower display polarizer P32 of the display module 30, the lower display polarizer P32 in the display module 30 may be omitted. In the electronic device C3, the lower substrate (not shown) in the display module 30 may be directly bonded to the second upper polarizer P21 in the second viewing angle switchable module 20 by the adhesive (the intermediate layer 312d). That is, the display module 30 and the second viewing angle switchable module 20 may share the same second upper polarizer P21. In some embodiments of the present disclosure, as shown in the electronic device C3 in FIG. 8, one polarizer (i.e., the second upper polarizer P21) needs to be disposed between the second liquid crystal unit LC2 and the display layer 300 of the display module 30.

In some embodiments, the polarizer adjacent to the back light module 40 may be further omitted. Therefore, as shown in the electronic devices C2 and C4, since the back light module 40' may emit polarized light corresponding to the light passing through the second lower polarizer P22, the second lower polarizer P22 is further omitted. It should be noted that, in the electronic devices C1 to C4, since the display module 30 is disposed between the first viewing angle switchable module 10 and the second viewing angle switchable module 20, the parameters of the third absorption axis AX3 in Table 1 and Table 2 may be adjusted (e.g., rotated by 90 degrees) corresponding to the polarizer of the display module 30.

Continuing, as shown in Table 3, the parameters of the electronic devices A3 and C3 are exemplified, but the present disclosure is not limited thereto. The electronic device A3 corresponds to Example 9 in Table 2. Under the same conditions as the parameters of the first liquid crystal unit LC1 of the electronic device A3, the parameters of other elements of the electronic device C3 may be adjusted.

TABLE 3

| A3 | the electronic device | C3 |
|---|---|---|
| 0 degrees (180 degrees) | the absorption axis AX31 of the upper display polarizer P31 | none | none |
| 90 degrees (270 degrees) | the absorption axis AX11 of the first upper polarizer P11 (as the first polarizer P1) | 90 degrees (270 degrees) |
| 0 degrees | the first alignment axis AL1 of the first alignment layer 104A | 0 degrees |
| E mode left-handed | the first liquid crystal layer 107 | E mode left-handed |
| 90 degrees | the second alignment axis AL2 of the second alignment layer 108A | 90 degrees |
| 0 degrees (180 degrees) | the absorption axis AX12 of the first lower polarizer P12 (as the second polarizer P2) | 0 degrees (180 degrees) |
| None | None | the absorption axis AX21 of the second upper polarizer P21 | 90 degrees (270 degrees) |
| 90 degrees | the third alignment axis AL3 of the third alignment layer 204A | 90 degrees |
| E mode left-handed | the second liquid crystal layer 207 | O mode left-handed |
| 180 degrees | the fourth alignment axis AL4 of the fourth alignment layer 208A | 180 degrees |

TABLE 3-continued

| A3 | the electronic device | C3 |
|---|---|---|
| 90 degrees (270 degrees) | the absorption axis AX22 of the second lower polarizer P22 (as the third polarizer P3) | 0 degrees (180 degrees) |
| unpolarized light | back light module 40 | unpolarized light |

As shown in Table 3, in the electronic device C3, the display module 30 is disposed between the first viewing angle switchable module 10 and the second viewing angle switchable module 20. Thus, the absorption axis AX22 of the second lower polarizer P22 (referred to as the third polarizer P3) is rotated by 90 degrees, and the second liquid crystal layer 207 is changed to O mode correspondingly. Therefore, in the electronic device A3, the angle of the absorption axis AX11 of the first upper polarizer P11 (referred to as the first polarizer P1) is 90 degrees. The light passing through the second lower polarizer P22 corresponds to the polarized light incident on the second liquid crystal layer 207. Thus, it represents that the polarization direction of the polarized light incident on the second liquid crystal layer 207 is 0 degrees. Therefore, in the electronic device A3, the angle of the absorption axis of the first polarizer P1 is perpendicular to the polarization direction of the polarized light. Furthermore, in the electronic device C3, the angle of the absorption axis AX11 of the first upper polarizer P11 (referred to as the first polarizer P1) is 90 degrees. The light passing through the second lower polarizer P22 corresponds to the polarized light incident to the second liquid crystal layer 207. Thus, it represents that the polarization direction of the polarized light incident to the second liquid crystal layer 207 is 90 degrees. Therefore, in the electronic device C3, the angle of the absorption axis of the first polarizer P1 is the same as the polarization direction of the polarized light.

In some embodiments, the display layer 300 of the display module 30 may be or may include a liquid crystal display layer, a quantum dots display layer, an organic light emitting diode display layer, a mini light emitting diodes display layer, a micro light emitting diode display layer, a quantum dot light emitting diode display layer, a phosphor display layer, a fluorophor display layer, other suitable display layers, or a combination of the foregoing, but the present disclosure is not limited thereto.

In some embodiments, the air layer 410 may be disposed between the second viewing angle switchable module 20 and the back light module 40 or 40'. In some embodiments, refer to FIGS. 6 to 8, in some embodiments, the first viewing angle switchable module 10, the second viewing angle switchable module 20, and the display module 30 may be connected by the intermediate layer. For example, the display module 30 and the first viewing angle switchable module 10 may be connected by the intermediate layer 311d, and the first liquid crystal unit LC1 and the second liquid crystal unit LC2 may be connected by the intermediate layer 312d, but the present disclosure is not limited thereto. In some embodiments, the intermediate layer 311d, the intermediate layer 312d, and/or the intermediate layer 313d may include or may be a connection layer or an air layer. For example, the connection layer may include or may be an optically clear adhesive (OCA), an optically clear resin (OCR), other suitable connection materials, or a combination of the foregoing, but the present disclosure is not limited thereto. For example, the connection layer may include or may be an acrylic acid-based material.

In some embodiments, for example, refer to FIGS. 6 to 8, the intermediate layer 313d and a protective layer 320 may be further disposed on the display module 30. For example, the protective layer 320 and the display module 30 may be connected by the intermediate layer 313d. In other embodiments, the intermediate layer 313d and the protective layer 320 are further disposed on the first viewing angle switchable module 10 and/or the second viewing angle switchable module 20. In some embodiments, the materials of the intermediate layer 313d, the intermediate layer 311d or the intermediate layer 312d may be the same or different. In some embodiments, the protective layer 320 may protect the substrate and may include functional layers. The functional layers may include an anti-reflection layer, an anti-fouling layer, an anti-glare layer, or a combination thereof. The anti-reflection layer may reduce the reflectivity of electronic devices. In some embodiments, the anti-reflection layer may include or may be a metal layer, a material with high reflectivity, other suitable materials, or a combination of the foregoing.

FIG. 9 shows a detailed structure of the electronic device. Please refer to FIG. 9 and the electronic device A3 in FIG. 6 at the same time. In some embodiments, the first liquid crystal unit LC1 may include the substrate 100S, the first electrode 102E, the first alignment layer 104A, the first liquid crystal layer 107, the second alignment layer 108A, the second electrode 110E, and the substrate 112S which are sequentially (from top to bottom) disposed in the third direction D3. The second liquid crystal unit LC2 may include the substrate 200S, the third electrode 202E, the third alignment layer 204A, the second liquid crystal layer 207, the fourth alignment layer 208A, the fourth electrode 210E, and the substrate 212S which are sequentially (from top to bottom) disposed in the third direction D3. In some embodiments, the first electrode 102E and the second electrode 110E are used to apply a voltage to turn the first liquid crystal layer 107 disposed between the first electrode 102E and the second electrode 110E. The third electrode 202E and the fourth electrode 210E are used to apply a voltage to turn the second liquid crystal layer 207 disposed between the third electrode 202E and the fourth electrode 210E. In some embodiments, the first liquid crystal layer 107 and the second liquid crystal layer 207 are independently controlled.

In some embodiments, the substrate 100S, the substrate 112S, the substrate 200S, and/or the substrate 212S may be a flexible substrate or a rigid substrate. According to some embodiments, the abovementioned substrate may be a glass substrate, but the present disclosure is not limited thereto. In some embodiments, the first electrode 102E, the second electrode 110E, the third electrode 202E, and the fourth electrode 210E may be or may include transparent or opaque conductive materials. In some embodiments, the transparent conductive material may be indium tin oxide (ITO). In some embodiments, the conductive material may include copper (Cu), aluminum (Al), molybdenum (Mo), tungsten (W), gold (Au), chromium (Cr), nickel (Ni), platinum (Pt), Titanium (Ti), silver (Ag), alloys thereof, other suitable conductive materials, or a combination of foregoing, but the present disclosure is not limited thereto. In some embodiments, the first alignment layer 104A, the second alignment layer 108A, the third alignment layer 204A, and/or the fourth alignment layer 208A may include polyimide (PI), but the present disclosure is not limited thereto.

To sum up, according to the embodiment of the present disclosure, in the viewing angle switchable structure, the absorption axis of the first polarizer and the absorption axis of the second polarizer have different angles. The second liquid crystal layer is disposed between the second polarizer and the substrate of the second liquid crystal unit. The angle of the absorption axis of the first polarizer may be perpendicular to the polarization direction of the incident polarized light. In this way, the second polarizer may be used as a common polarizer for the first viewing angle switchable module and the second viewing angle switchable module. According to some embodiments, in the viewing angle switchable structure, the second liquid crystal layer is disposed between the display module and the substrate of the second liquid crystal unit. The angle of the absorption axis of the first polarizer and the polarization direction of the incident polarized light are the same. In this way, the second polarizer may be used as a common polarizer for the first viewing angle switchable module and the display module. By making at least two of the first viewing angle switchable module, the second viewing angle switchable module, and the display module share the polarizer, the number of polarizers may be reduced, the overall thickness of the electronic device, and/or the manufacturing cost may be reduced.

The features among the various embodiments may be arbitrarily combined as long as they do not violate or conflict with the spirit of the disclosure. In addition, the scope of the present disclosure is not limited to the process, machine, manufacturing, material composition, device, method, and step in the specific embodiments described in the specification. A person of ordinary skill in the art will understand current and future process, machine, manufacturing, material composition, device, method, and step from the content disclosed in some embodiments of the present disclosure, as long as the current or future process, machine, manufacturing, material composition, device, method, and step performs substantially the same functions or obtain substantially the same results as the present disclosure. Therefore, the scope of the present disclosure includes the above-mentioned process, machine, manufacturing, material composition, device, method, and steps. It is not necessary for any embodiment or claim of the present disclosure to achieve all of the objects, advantages, and/or features disclosed herein.

The foregoing outlines features of several embodiments of the present disclosure, so that a person of ordinary skill in the art may better understand the aspects of the present disclosure. A person of ordinary skill in the art should appreciate that, the present disclosure may be readily used as a basis for designing or modifying other processes and structures for carrying out the same purposes and/or achieving the same advantages of the embodiments introduced herein. A person of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
a first viewing angle adjusting unit comprising a first substrate, a second substrate, and a first liquid crystal layer disposed between the first substrate and the second substrate;
a second viewing angle adjusting unit comprising a third substrate, a fourth substrate, and a second liquid crystal layer disposed between the third substrate and the fourth substrate;
a display unit comprising a fifth substrate, a sixth substrate, and a display layer disposed between the fifth substrate and the sixth substrate, wherein the display unit is disposed between the first viewing angle adjusting unit and the second viewing angle adjusting unit;
a first polarizer, wherein the first substrate of the first viewing angle adjusting unit is disposed between the first polarizer and the first liquid crystal layer of the first viewing angle adjusting unit;
a second polarizer directly adhered between the second substrate of the first viewing angle adjusting unit and the fifth substrate of the display unit, wherein the first viewing angle adjusting unit and the display unit share the second polarizer;
a third polarizer directly adhered between the sixth substrate of the display unit and the third substrate of the second viewing angle adjusting unit, wherein the display unit and the second viewing angle adjusting unit share the third polarizer;
a light module; and
a fourth polarizer, wherein the fourth polarizer is disposed between the fourth substrate of the second viewing angle adjusting unit and the light module,
wherein an angle of an absorption axis of the first polarizer and an angle of an absorption axis of the second polarizer are perpendicular, the angle of the absorption axis of the second polarizer and an angle of an absorption axis of the third polarizer are perpendicular, and the angle of the absorption axis of the third polarizer and an angle of an absorption axis of the fourth polarizer are perpendicular.

2. The electronic device as claimed in claim 1, wherein the display unit comprises a third liquid crystal layer disposed between the fifth substrate and the sixth substrate.

3. The electronic device as claimed in claim 1, wherein the display unit comprises an organic light-emitting layer disposed between the fifth substrate and the sixth substrate.

4. The electronic device as claimed in claim 1, wherein the first viewing angle adjusting unit provides a privacy mode.

5. The electronic device as claimed in claim 4, wherein the first viewing angle adjusting unit is capable of being switchable between the privacy mode and a sharing mode.

6. The electronic device as claimed in claim 1, wherein the second viewing angle adjusting unit provides a privacy mode.

7. The electronic device as claimed in claim 6, wherein the second viewing angle adjusting unit is capable of being switchable between the privacy mode and a sharing mode.

8. The electronic device as claimed in claim 1,
wherein the first viewing angle adjusting unit comprises a first alignment layer disposed between the first substrate and the first liquid crystal layer; and a second alignment layer disposed between the second substrate and the first liquid crystal layer, wherein the second viewing angle adjusting unit comprises a third alignment layer disposed between the third substrate and the second liquid crystal layer; and a fourth alignment layer disposed between the fourth substrate and the second liquid crystal layer, and
wherein the angle of the absorption axis of the second polarizer and an alignment axis of the second alignment layer are perpendicular, and the angle of the absorption axis of the fourth polarizer and an alignment axis of the fourth alignment layer are parallel.

* * * * *